United States Patent [19]

Araps et al.

[11] Patent Number: 4,568,601
[45] Date of Patent: Feb. 4, 1986

[54] USE OF RADIATION SENSITIVE POLYMERIZABLE OLIGOMERS TO PRODUCE POLYIMIDE NEGATIVE RESISTS AND PLANARIZED DIELECTRIC COMPONENTS FOR SEMICONDUCTOR STRUCTURES

[75] Inventors: Constance J. Araps; George Czornyj, both of Wappingers Falls; Steven M. Kandetzke, Fishkill; Mark A. Takacs, Poughkeepsie, all of N.Y.

[73] Assignee: International Business Machines Corporation, Armonk, N.Y.

[21] Appl. No.: 663,017

[22] Filed: Oct. 19, 1984

[51] Int. Cl.⁴ .............. H01L 21/00; H01L 27/12; B44C 1/22; B32B 3/28
[52] U.S. Cl. .................. 428/167; 29/576 W; 29/580; 156/643; 156/648; 156/659.1; 156/668; 156/904; 2/159.11; 357/49; 427/43.1; 430/296; 522/174
[58] Field of Search .......... 156/643, 646, 648, 657, 156/655, 659.1, 662, 668, 904; 204/192 E, 159.11, 159.14, 159.15, 159.16, 159.17, 159.20; 357/49; 29/576 W, 580; 427/43.1; 430/283, 286, 296, 317; 428/167, 446, 473.5, 620

[56] References Cited

U.S. PATENT DOCUMENTS

| | | |
|---|---|---|
| 3,515,585 | 6/1970 | Chamberlin et al. ........... 117/212 |
| 3,700,497 | 10/1972 | Epifano et al. ................ 117/212 |
| 3,766,438 | 10/1973 | Castrucci et al. ............. 317/101 A |
| 3,796,613 | 3/1974 | Magdo et al. ................. 148/175 |
| 3,846,166 | 11/1974 | Saiki et al. .................. 117/212 |
| 3,961,355 | 6/1976 | Abbas et al. ................. 357/49 |
| 3,985,597 | 10/1976 | Zielinski ..................... 156/11 |
| 4,160,991 | 7/1979 | Anantha et al. ............... 357/49 |
| 4,164,458 | 8/1979 | Patel ......................... 204/159.17 |
| 4,333,794 | 6/1982 | Beyer et al. .................. 156/648 |
| 4,367,119 | 1/1983 | Logan et al. .................. 156/643 |
| 4,502,914 | 3/1985 | Trumpp et al. ................. 156/643 |

Primary Examiner—William A. Powell
Attorney, Agent, or Firm—Shirley Church Moore

[57] ABSTRACT

The photosensitivity of a particular group of polymerizable oligomers permits radiation induced polymerization. This photosensitivity thus enables the polymerizable oligomers to be used as photoresists in general, and facilitates in situ cure when the oligomers are used to produce isolation films and trenches in semiconductor devices. The photosensitivity further enables use of a simplified planarization process when the polymerizable oligomers are used in the fabrication of semiconductor structures and integrated circuit components. Specifically, the polymerizable oligomers are comprised of poly N-substituted amic acids, the corresponding amic esters, the corresponding amic isoimides, the corresponding amic imids or mixtures thereof, wherein the end groups of the polymerizable oligomer are end capped with a vinyl or acetylinic end group.

27 Claims, 5 Drawing Figures

USE OF RADIATION SENSITIVE POLYMERIZABLE OLIGOMERS TO PRODUCE POLYIMIDE NEGATIVE RESISTS AND PLANARIZED DIELECTRIC COMPONENTS FOR SEMICONDUCTOR STRUCTURES

BACKGROUND OF THE INVENTION

Polyimides have found wide use in the semiconductor industry as insulating or passivating materials in electronic components. This use is documented in the form of U.S. patents which disclose the use of polyimides, polyimide-polyamide or like materials, among which are: U.S. Pat. Nos. 3,700,497 Epifano et al; 3,846,166 Saiki et al; 3,486,934 Bond; 3,515,585 Chamberlin et al; 3,985,597 Zielenski; and 4,367,119 Logan et al.

High density electronic components have necessitated the development of dielectrically isolated semiconductor devices. Isolation between active and passive devices has been achieved using pockets or trenches of dielectric within structural regions of conductor and semiconductor materials. Examples of such structures are described in U.S. Pat. Nos. 3,766,438 Castrucci et al.; 3,796,613 Magdo et al.; 3,961,355 Abbas et al.; 3,985,597 Zielenski; 4,160,991 Anantha et al.; and 4,333,794 Beyer et al. Polyimides are frequently used as the dielectric material within the trenches of the semiconductor structures.

Filling of the pockets or trenches in semiconductor structures with a polyimide dielectric material is often accomplished using multiple coating processes. Each solution coating of the desired polyimide dielectric is followed by a plasma etch-back step in an attempt to planarize the surface area coated (which includes not only the trench, but also multiple geometries in the area surrounding the trench). Such multiple coating and etch-back steps are not only costly, but increase the possibility of contamination of the electronic component during processing.

The polyimide dielectric material is frequently applied to the surface of a semiconductor structure via solution coating, wherein the polyimide is dissolved in a suitable solvent, the solution is applied to the substrate, and the solvent is evaporated away, leaving a film of polyimide on the substrate surface. Often the viscosity of the solution of the desired polyimide is too high to facilitate proper application to the substrate. This problem has been solved by utilization of polymerizable oligomers which can be reacted in situ (on the substrate surface) to produce the desired polyimide dielectric. This method of producing dielectric electronic components is described in U.S. patent application Ser. Nos. 556,731 and 556,734, both filed Nov. 30, 1983 (assigned to the assignee of the present invention). The reaction of the polymerizable oligomers to produce a cured polyimide film is carried out using a thermal cure, with the temperature of cure depending on whether a catalyst is used to increase the reaction rate at lower temperatures. A statement was made in U.S. application Ser. No. 556,734 that theoretically radiation assisted cures were possible wherein radiation could be used to initiate the photosensitive catalyst, but there was no discussion of the sole use of radiation to cure the polymerizable oligomers. Application Ser. No. 556,731 lists radiation assisted cures or radiation curing as a possible method of cure, but states that thermal cure is preferred in any event due to simplicity and low expense.

It has previously been recognized that reaction of polymerizable oligomers containing vinyl or acetylinic groups may be initiated using radiation as an alternative to a thermal (oven) cure. For purposes of this discussion and the claims made herein, "radiation" should be interpreted to include both photon (ultraviolet light from 150 nm–600 nm) and radiation emission sources such as X-ray, electron beam, and ion beam. Depending on the oligomer, it may be necessary to add an additional reactant which is sensitive to the radiation in order to increase the speed and probability of oligomer reaction. Examples of such photo-initiated reactions are described in U.S. Pat. No. 4,164,458 Patel, and by Gupta et al., in "Photo Crosslinking and Photografting of Vinyl Polymers Using Poly(styrene-co-p-vinyl-benzophenone-p'-tert-butyl perbenzoate) as a Comonomer" *Journal of Polymer Science: Polymer Chemistry Edition*, Vol. 20, 147-157 (1982). The Patel patent provides a method wherein a mixture of diacetylene monomer, oligomer, and/or polymer is combined with a thermoplastic crosslinkable polymer, and the combination is subjected to actinic radiation or high energy ionizing radiation in order to achieve inter reaction between the various components of the mixture. Gupta et al. discuss benzophenone-triplet photochemical crosslinking of polymers, use of p-(p'vinylbenzoyl)peroxybenzoic acid-t-butyl ester photo initiator (VBPE), and a study of the photoreactivity of polystyrenes containing a low percentage of the VBPE photoinitiator. It is assumed the inventors of U.S. patent application Ser. Nos. 556,731 and 556,734 (described above) based their statements, that theoretically radiation cure or radiation assisted cure might be possible, on descriptions found within the literature, since no statement was made that radiation cure had been attempted nor that it had been successful.

SUMMARY OF THE INVENTION

The present invention provides a method of utilizing radiation to polymerize dielectrics of the type discussed in U.S. patent application Ser. Nos. 556,731, and 556,734. Radiation induced cure enables the use of such polymeric dielectrics as photoresists in general, and facilitates in situ cure when the polymeric dielectrics are used to produce isolation films in multilayer devices, to fill isolation trenches within semiconductor structures and for similar applications. In the case of isolation trenches, the use of radiation-induced polymerization permits a simplified method of planarization of the polymeric dielectrics.

In accordance with the present invention, it has been discovered that polymerizable oligomers selected from the group consisting of poly N-substituted amic acids, the corresponding amic esters, the corresponding isoimides, the corresponding imides and mixtures thereof, wherein the polymerizable oligomer is vinyl or acetylenic end-capped, can be coupled and crosslinked using radiation as the method of initiating reaction, wherein the method comprises:

(a) providing a polymerizable oligomer, wherein the polymerizable oligomer is selected from the group consisting of poly N-substituted amic acids, corresponding amic esters, corresponding isoimides, corresponding imides, and mixtures thereof, and wherein the polymerizable oligomer is vinyl or acetylinic end-capped; and (b) exposing the polymerizable oligomer to radiation sufficient to initiate inter-reaction between molecules of the polymerizable oligomer.

In addition, the above radiation-induced reaction facilitates use of the polymerizable oligomer as a negative photoresist, wherein the method comprises:

(a) providing a layer of a polymerizable oligomer, wherein the polymerizable oligomer is selected from the group consisting of poly N-substituted amic acids, corresponding amic esters, corresponding isoimides, corresponding imides, and mixtures thereof, and wherein the polymerizable oligomer is vinyl or acetylinic end-capped; and (b) pattern-wise exposing the layer to radiation to couple and cross-link the irradiated portions thereof.

Also, since the above radiation induced reaction permits selective reaction in areas of a layer of the polymerizable oligomer, this phenomenon can be used to simplify the planarization process when the polymerizable oligomer is utilized to fill pocket or trench areas within semiconductor structures.

The simplified planarization process for fabrication of a semiconductor structure wherein insulator isolating portions are comprised of a polymeric dielectric in the form of integral pockets or trenches within the substrate geometry comprises:

(a) applying a layer of a polymerizable oligomer upon the semiconductor structure and concurrently filling the trenches thereof, wherein the polymerizable oligomer is selected from the group consisting of poly N-substituted amic acids, the corresponding amic esters, the corresponding isoimides, the corresponding imides and mixtures thereof, and wherein the polymerizable oligomer is vinyl and/or acetylenic end-capped;

(b) pattern-wise exposing the layer to radiation in the area of the trenches, to couple and crosslink the polymerizable oligomer in the irradiated trench areas;

(c) developing the layer to remove the non-irradiated portions thereof; and (d) coating the semiconductor structure with a resist material to a level above the irradiated portions of the polymerizable oligomer layer remaining after step (c).

An additional step of a single reactive-ion etch-back may be utilized to remove the resist material applied in step (d) above and any remaining polymeric material on the semiconductor structural surface above and surrounding the trench area, thus insuring that adjacent areas containing conductor contacts will be fully exposed and that the polymeric dielectric surface of the filled trench will be planar at the desired level, within the structure.

DESCRIPTION OF THE PREFERRED EMBODIMENTS

Figure 1:
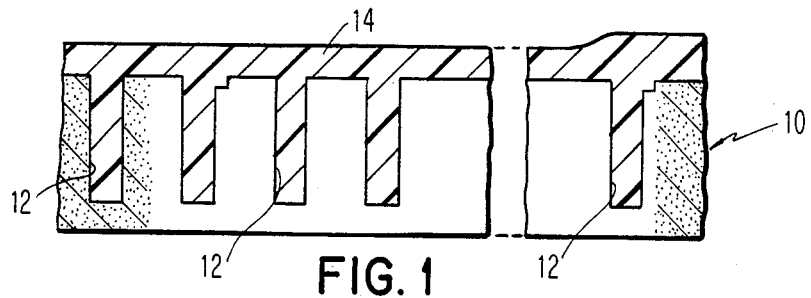
FIG. 1 is a diagrammatic cross-sectional view of a semiconductor structure containing trenches, wherein a layer of polymerizable oligomer has been applied to cover the substrate and fill the trenches.

The photosensitivity of a particular group of polymerizable oligomers permits radiation induced polymerization. Specifically, the polymerizable oligomers are comprised of poly N-substituted amic acids, the corresponding amic esters, the corresponding isoimides, the corresponding imids or mixtures thereof, wherein the end groups of the polymerizable oligomer are end-capped with a vinyl or acetylinic end group. The photosensitivity enables the polymerizable oligomers to be used as photoresists which function well at high temperatures, and facilitates in situ reaction/polymerization of the oligomer in semiconductor device applications.

The photosensitivity of polymerizable oligomers of the type described above has been demonstrated utilizing a polyisoimide to produce positive image patterns as small as 0.5 microns in width.

EXAMPLE I

IP-600 polyisoimide (supplied by the National Starch Corporation) was placed in solution at 38.4% by weight solids in 1-methyl-2-pyrrolidone. A blanket film of the solution was spun coated onto a silicon substrate (wafer) to achieve a final film thickness of 2.4 microns (after solvent removal). No photosensitizer was used in combination with the polyisoimide. The wafer was then baked on a 160° C. hot plate for 20 minutes to facilitate solvent removal.

The film-coated wafer was then exposed to electron beam (E-beam) radiation on an E-beam tool utilizing a standard E-beam test pattern for photosensitive materials. After a 100 micro-coulomb total dose of radiation, the image created by the radiation induced polymerization of the polyisoimide was developed using 2-methoxyethyl ether. After removal of the non-irradiated areas of the film by the development process, positive image patterns as small as 0.5 microns in width were obtained.

The IP-600 polyisoimide used in EXAMPLE I was of the structure shown below.

POLY(ISOIMIDE)

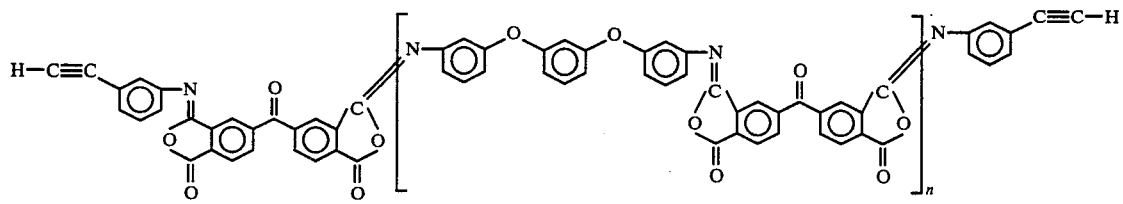

where n=0 to about 50, with n=about 30 preferred

It follows that polymerizable oligomers of the corresponding polyamic acid, corresponding amic ester and corresponding imide should also be capable of radiation induced reaction. Their structures are shown below.

-continued

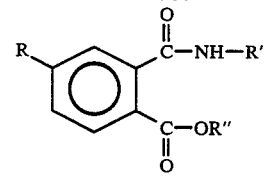

POLY(AMIC ACID)

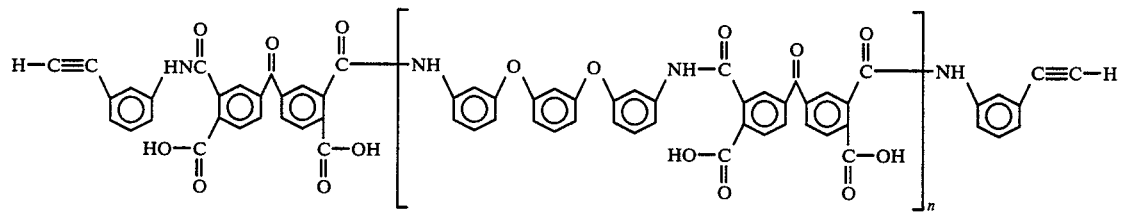

POLY(AMIC ESTER)

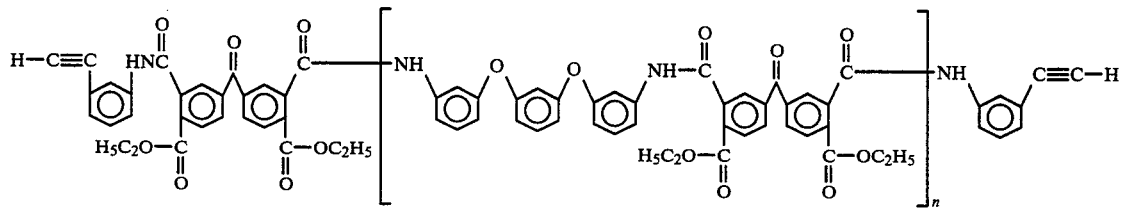

POLY(IMIDE)

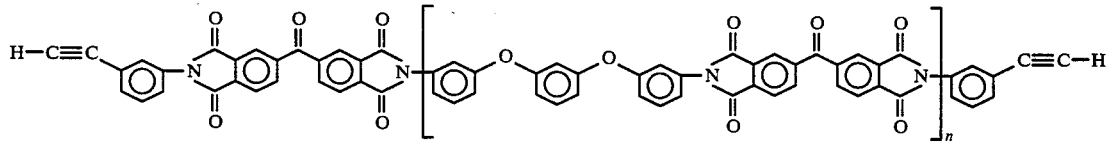

where n=0 to about 50, with n=about 30 preferred.

Similar poly N-substituted amic acids, esters, isoimides, and imides are capable of the same radiation induced reaction. The key structural requirements are:

(1) presence of a compound selected from the group consisting of:

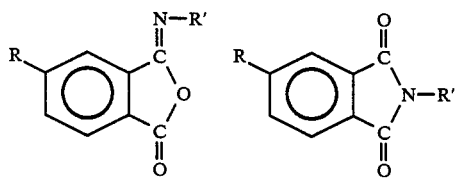

within the oligomer, where R and R' may be aliphatic or aromatic groups and R" may be hydrogen or an aliphatic group.

and (2) presence of vinyl or acetylinic groups as endcaps on the oligomer molecule.

Preferred R and R' groups are comprised of:

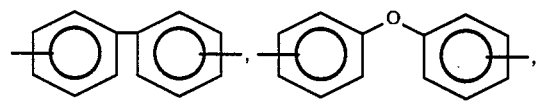

-continued

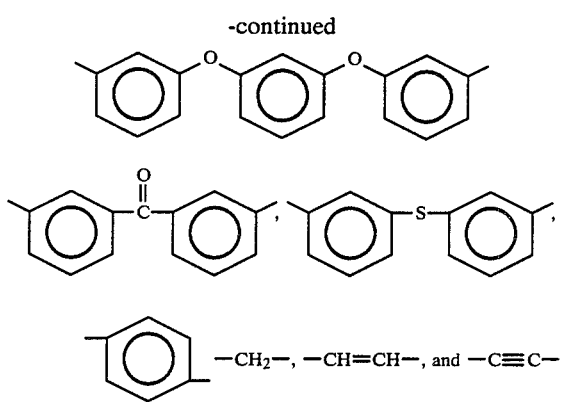

and preferred R" groups are comprised of H and $C_nH_{2n+1}$, wherein n ranges from 1 to about 10.

The polyisoimide and polyimide are preferred, as their polymerization produces no volatile by-products which can cause problems in subsequent process steps.

The photosensitivity described above was used to simplify the planarization process when the polymerizable oligomer was used to fill trench areas within a semiconductor structure.

EXAMPLE II

IP-600 polyisoimide polymerizable oligomer was applied to a semiconductor structure as shown in FIG. 1. Application was via spin coating of a solution comprised of about 38% by weight solids in 1-methyl-2-pyrrolidone. The final film thickness, after a 160° C. bake to remove the solvent, was about 2.4 microns on the semiconductor upper surface and about 5 to 6 microns in trench areas. The resultant composite was as shown in the FIG. 1 cross-sectional view, wherein the semiconductor structure 10 had a geometry including trenches 12 which were filled with polymerizable oligomer 14. Note the variation in final film thickness on the semiconductor structure 10 upper surface which is the result of a difference in the concentration of trenches 12 within localized areas of the semiconductor structure 10.

Figure 2:
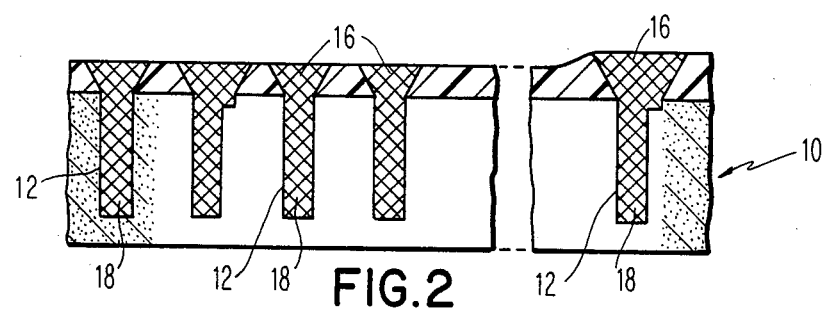
FIG. 2 shows the same cross-sectional view after exposure of the polymerizable layer to radiation in the area of the trenches.
Figure 3:
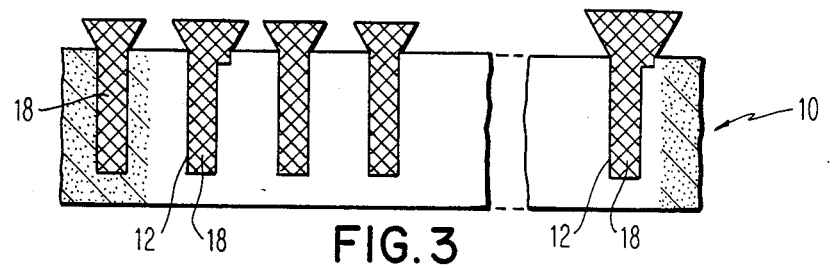
FIG. 3 depicts the cross-sectional view after development of the polymerizable layer to remove the non-irradiated portions thereof.

The areas 16 over the trenches 12 were then exposed to radiation adequate to induce reaction and produce a polymer 18 within the trenches 12, as shown in FIG. 2. A trench mask can be overlaid onto the substrate in the desired trench pattern, with subsequent UV or E-beam, or other high energy radiation source exposure through the openings in the mask. As an alternative, direct focused E-beam or ion beam exposure of each area to be irradiated can be utilized so that an overlay mask is not necessary. In the case of the IP-600 polyisoimide, an E-beam dose of about 50 to 100 micro coulombs/cm$^2$ was sufficient to obtain adequate polymerization. The polymerization effectively rendered the irradiated polymeric material insoluble relative to the non-irradiated oligomeric material. The non-irradiated oligomeric material was subsequently selectively dissolved away using diglyme(2-methoxyethyl ether), to produce the structure shown in FIG. 3.

Figure 4:
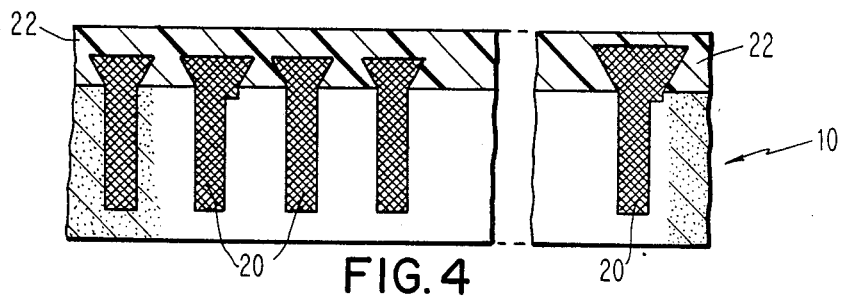
FIG. 4 shows the cross-sectional view after application of a coating of resist material to a level above the irradiated portions of the polymerizable layer remaining after development.

After dissolution (development) of the non-irradiated regions, additional cure of the partially coupled and crosslinked oligomer was accomplished thermally at about 400° C. The time period used for cure ranges between about 30 minutes and about 4.5 hours, depending on the desired properties of the resultant polyimide. The result is a more highly coupled and crosslinked polymeric (polyimide) dielectric 20, as shown in FIG. 4. The surface of the semiconductor structure was then coated with the polymerized oligomer resist material 22. The resist material 22 may be comprised of the polymerizable oligomer or another polymer which exhibits dry etch characteristics equivalent to the polymeric dielectric 20. The depth of coating after bake to remove solvent was sufficient that the resulting surface was planar as shown in FIG. 4.

Figure 5:
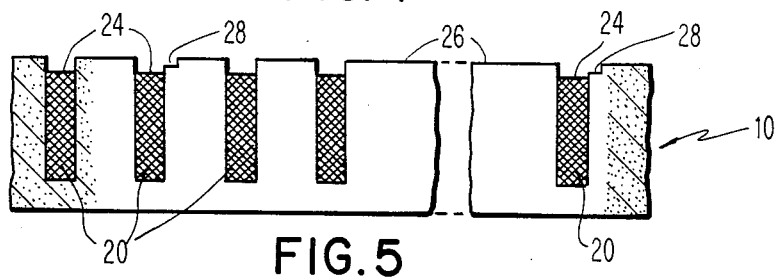
FIG. 5 shows the cross-sectional view after planarization via reactive-ion etch-back to remove the resist material and portions of the polymerizable layer remaining above the trench areas, and to insure that adjacent conductor contact areas are fully exposed.

Additional planarization was then achieved in a single etch-back. Reactive ion etching is the preferred etch-back method, wherein either isotropic or anisotropic oxygen plasma is used. The cross-sectional view of the final planarized structure depicted in FIG. 5 shows the polyimide dielectric 20 with surfaces 24 etched below the semiconductor surface 26. The depth of etching can be controlled by the etch-back method and etch time period. The etch-back removed polymeric material on the surface 26 of the semiconductor structure 10 and provided for exposure of contact areas 28 within the semiconductor structure. Note the uniformity of surface level 24 of the polyimide dielectric 20 within the trenches which was obtained upon etch back of the planarized surface generated in prior processing steps.

The above examples present the best modes contemplated for carrying out typical applications of the present invention. This invention is, however, susceptible to modification and alternate constructions from the embodiments shown in terms of applications (such as photoresists, insulating/isolating films, and dielectric trench fill) and process parameters (such as radiation sources and dosages, development solvents used, time-temperature profiles and method of dry etching). Consequently, it is not intended to limit this invention to the particular embodiments disclosed. On the contrary, the intent is to cover all modifications and alternate constructions falling within the spirit and scope of the invention as expressed in the appended claims.

What is claimed is:

1. A method initiating reaction in a polymerizable oligomer wherein said method comprises:
    (a) providing said polymerizable oligomer, wherein said polymerizable oligomer is selected from the group consisting of poly N-substituted amic acids, corresponding amic esters, corresponding isoimides, corresponding imides, and mixtures thereof, and wherein said polymerizable oligomer is vinyl or acetylinic end-capped; and
    (b) exposing said polymerizable oligomer to radiation sufficient to initiate inter-reaction between molecules of said polymerizable oligomer.

2. Product produced by the method of claim 1.

3. A method of forming a selectively patterned protective layer on a substrate comprising:
    (a) providing a layer of a polymerizable oligomer, wherein said polymerizable oligomer is selected from the group consisting of poly N-substituted amic acids, corresponding amic esters, corresponding isoimides, corresponding imides, and mixtures thereof, and wherein said polymerizable oligomer is vinyl or acetylinic end-capped; and
    (b) pattern-wise exposing said layer to radiation to couple and cross-link the irradiated portions thereof.

4. A method of forming a selectively patterned protective layer on a substrate comprising:

(a) blanket coating said substrate with a solution of a polymerizable oligomer wherein said polymerizable oligomer is selected from the group consisting of poly N-substituted amic acids, the corresponding amic esters, the corresponding isoimides, the corresponding imides, and mixtures thereof, and wherein the end groups of said polymerizable oligomer are end capped with a vinyl or acetylinic end group;

(b) baking said coated substrate to remove substantially all of the solvent of said solution;

(c) pattern-wise exposing said coating to radiation, to couple and cross-link the irradiated portions thereof; and (d) developing said coating to remove the non-irradiated portions thereof.

5. The method of claim 4 wherein said radiation source is E-beam.

6. The method of claim 5 wherein said polymerizable oligomer is comprised of N-substituted polyisoimides end-capped with vinyl or acetylenic end groups.

7. The method of claim 6 wherein said solution of said polyisoimide comprises about 38% weight of said polyisoimide in a solvent of 1-methyl-2-pyrrolidone.

8. The method of claim 7 wherein said developing is effected with 2-methoxyethyl ether.

9. A method of forming a selectively patterned protective layer on an integrated circuit device, comprising:

(a) coating an acetylene-terminated N-substituted polyisoimide on said device;

(b) pattern-wise exposing said coating to radiation to couple and cross-link the irradiated portions of said coating; and (c) developing said coating by removing the non-irradiated portions of said coating with a solvent.

10. The method of claim 9 wherein the radiation source is E-beam.

11. Product produced by the method of claim 9.

12. A method of fabricating semiconductor structures having insulator isolating trenches formed therein, wherein the insulator comprises a polymeric dielectric, comprising:

(a) applying a layer of a polymeric oligomer upon said semiconductor structure and concurrently filling the trenches thereof, wherein said polymerizable oligomer is selected from the group consisting of poly N-substituted amic acids, the corresponding amic esters, the corresponding isoimides, the corresponding imides, and mixtures thereof, and wherein the end groups of said polymerizable oligomer are end capped with a vinyl or acetylinic end group;

(b) pattern-wise exposing said layer to radiation in the area of said trenches to couple and cross-link the irradiated portions thereof;

(c) developing said layer to remove the non-irradiated portions thereof; and (d) coating said semiconductor structure with a resist material to a level above the irradiated portions of said polymerizable oligomer layer remaining after step (c).

13. The method of claim 12 including the additional step of:

(e) reactive ion etching the surface of said coated semiconductor structure to remove polymeric material from the upper surface of said semiconductor structure and to obtain the desired level of said polymerized oligomer within the trenches thereof.

14. The method of claim 13 wherein said polymerizable oligomer is an N-substituted polyisoimide end-capped with vinyl or acetylenic end groups.

15. The method of claim 14 wherein said radiation source is E-beam.

16. The method of claim 15 wherein said reactive ion etching is by oxygen.

17. Product produced by the method of claim 12.

18. A method of fabricating semiconductor structures having insulator isolating portions formed therein, wherein said insulator comprises a polymeric dielectric, comprising:

(a) blanket coating said semiconductor structure with a solution of a polymerizable oligomer wherein said polymerizable oligomer is selected from the group consisting of poly N-substituted amic acids, the corresponding amic esters, the corresponding amic isoimides, the corresponding imides, and mixtures thereof, and wherein the end groups of said polymerizable oligomer are end capped with a vinyl or acetylinic end group;

(b) baking the coated substrate to remove substantially all of the solvent of said solution;

(c) pattern-wise exposing said coating to radiation to couple and cross-link the irradiated portions thereof;

(d) developing said coating to remove the non-irradiated portions thereof;

(e) thermally curing said irradiated portions of said polymerizable oligomer to produce the desired polymeric dielectric structure;

(f) coating said semiconductor structure with a resist material to a level above said irradiated portions of said polymerizable oligomer remaining after step (e); and (g) reactive ion etching the surface of said semiconductor structure to remove polymeric material from the upper surface of said semiconductor structure and to obtain the desired level of said polymerized oligomer within the trenches thereof.

19. The method of claim 18 wherein said polymerizable oligomer is an N-substituted polyisoimide end capped with vinyl or acetylenic end groups.

20. The method of claim 19 wherein said radiation source is E-beam.

21. The method of claim 20 wherein said irradiated portions are thermally cured at about 400° C. for periods ranging between about 30 minutes and about 4.5 hours.

22. The method of claim 21 wherein said reactive ion etching is by oxygen.

23. The product produced by the method of claim 18.

24. The method of claim 1 wherein said poly N-substituted amic acids, corresponding amic esters, corresponding isoimides and corresponding imides are selected from the group consisting of:

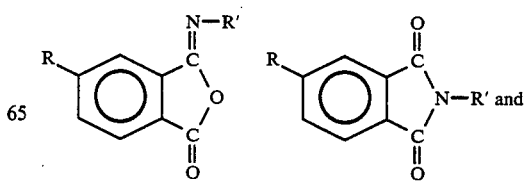 and

-continued

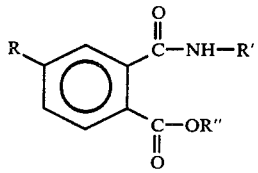

wherein R and R' are selected from the group consisting of:

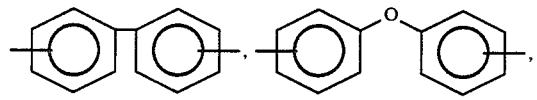

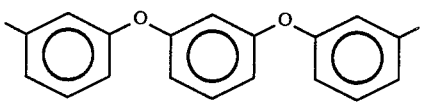

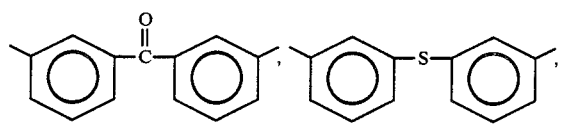

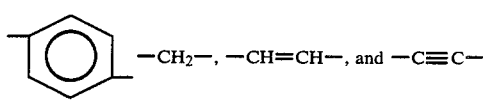

and wherein R" is selected from the group consisting of hydrogen and $C_nH_{2n+1}$ wherein n ranges from 1 to about 10.

25. The method of claim 3 wherein said poly N-substituted amic acids, corresponding amic esters, corresponding isoimides and corresponding imides are selected from the group consisting of:

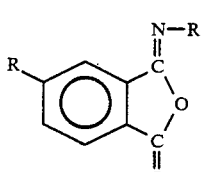 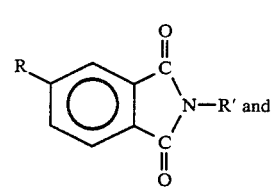

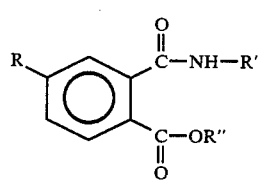

wherein R and R' are selected from the group consisting of:

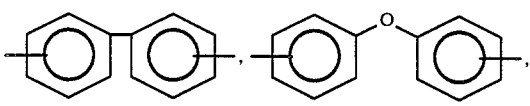

-continued

and wherein R" is selected from the group consisting of hydrogen and $C_nH_{2n+1}$ wherein n ranges from 1 to about 10.

26. The method of claim 4 wherein said poly N-substituted amic acids, corresponding amic esters, corresponding isoimides and corresponding imides are selected from the group consisting of:

wherein R and R' are selected from the group consisting of:

and wherein R" is selected from the group consisting of hydrogen and $C_nH_{2n+1}$ wherein n ranges from 1 to about 10.

27. The method of claim 26 wherein said radiation source is E-beam.

* * * * *